(12) United States Patent
Takizawa

(10) Patent No.: US 6,198,663 B1
(45) Date of Patent: Mar. 6, 2001

(54) NON-VOLATILE SEMICONDUCTOR MEMORY IC

(75) Inventor: Noboru Takizawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/361,904

(22) Filed: Jul. 27, 1999

(30) Foreign Application Priority Data

Oct. 12, 1998 (JP) .................................................. 10-288598

(51) Int. Cl.$^7$ ................................................. G11C 16/04
(52) U.S. Cl. ............................. 365/185.29; 365/185.33; 365/200; 365/201
(58) Field of Search ................................. 365/200, 201, 365/185.29, 185.33

(56) References Cited

U.S. PATENT DOCUMENTS 4,556,975 * 12/1985 Smith .................................... 365/200

* cited by examiner

Primary Examiner—Terrell W. Fears
(74) Attorney, Agent, or Firm—Coudert Brothers

(57) ABSTRACT

A non-volatile semiconductor memory IC has both a flash memory and a CPU mounted thereon. The CPU is provided with a ROM which stores a program code and a memory device such as a SRAM. The CPU functions by the stored program code to perform various functions such as accessing the flash memory to thereby carry out a test to determine a good/bad condition of the flash memory, temporarily storing results of the test in the memory device, and copying the test results from the memory device into the flash memory.

14 Claims, 4 Drawing Sheets

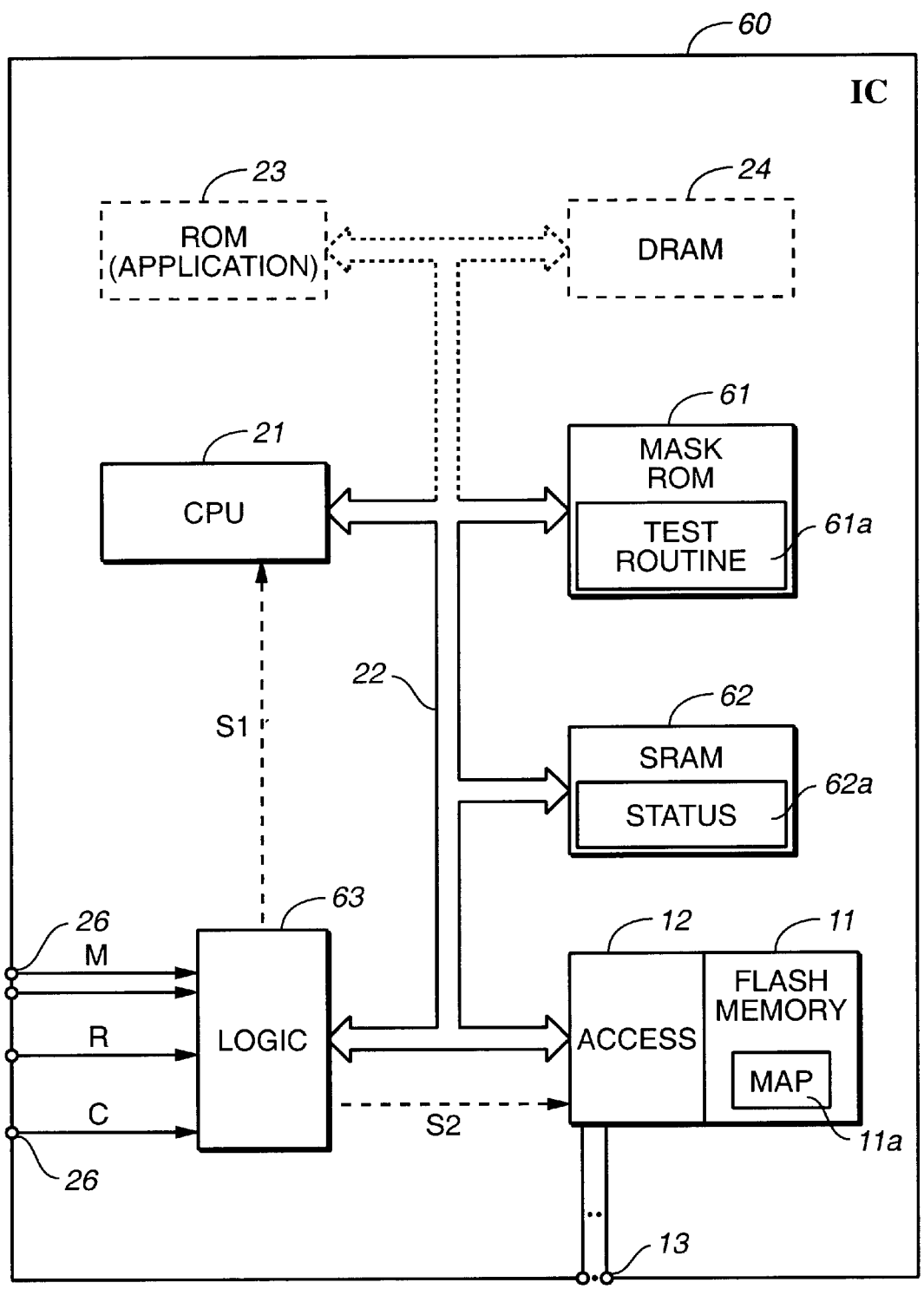
FIG._1

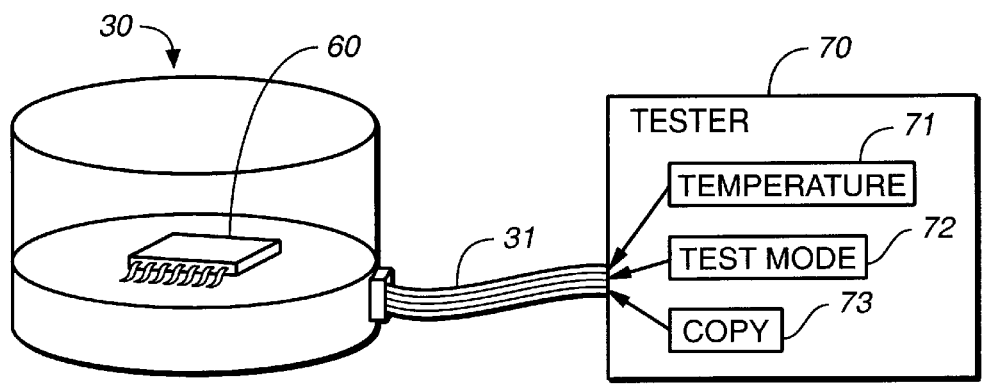
FIG._2
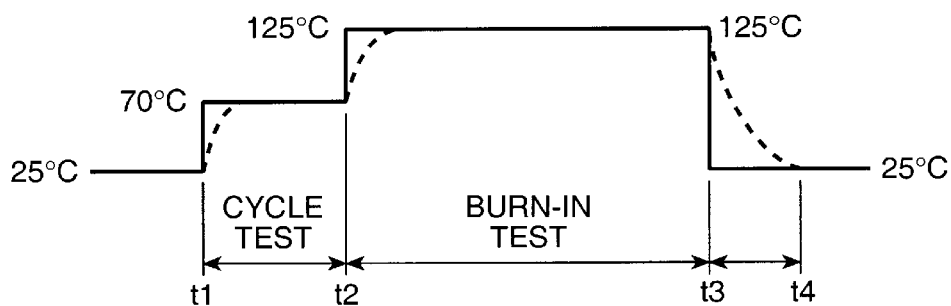
FIG._3A
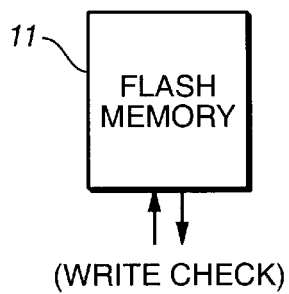
FIG._3B
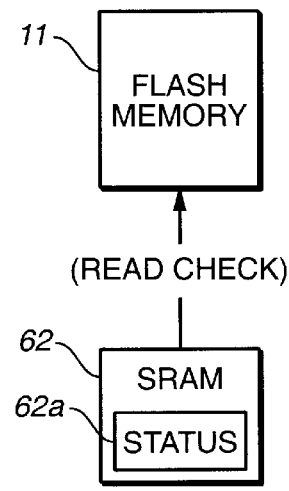
FIG._3C
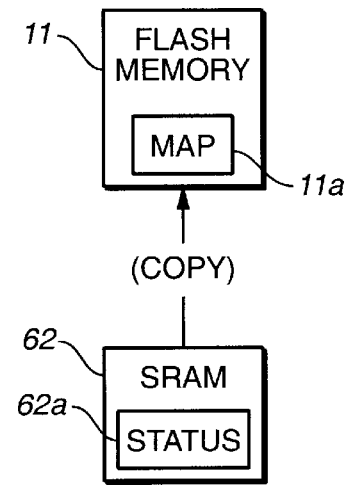
FIG._3D

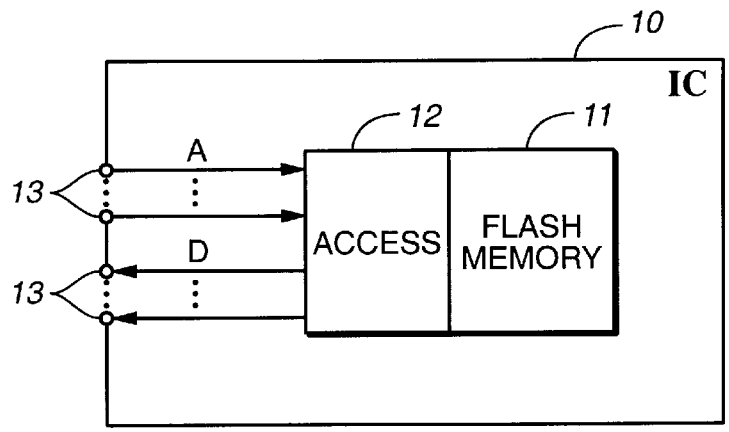
FIG._4 (PRIOR ART)
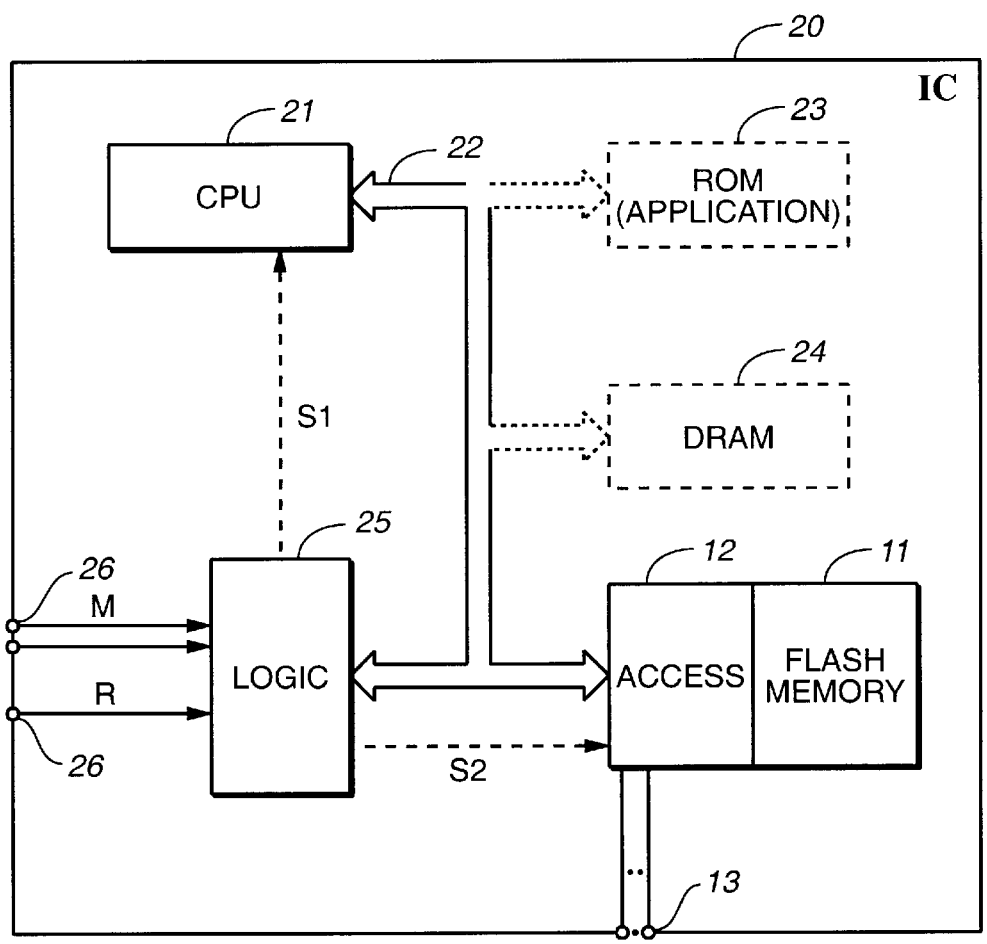
FIG._5 (PRIOR ART)

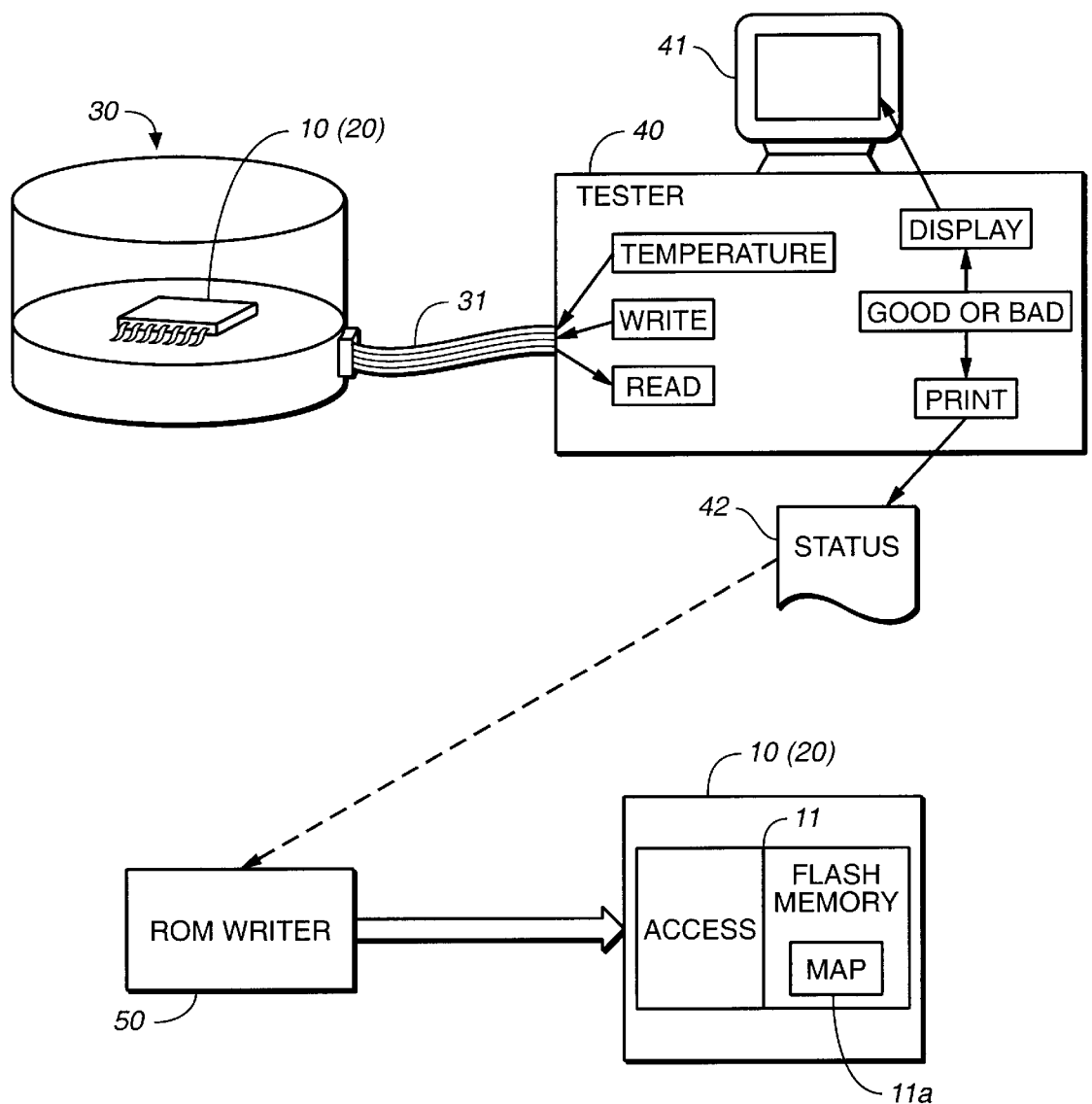
FIG._6 *(PRIOR ART)*

NON-VOLATILE SEMICONDUCTOR MEMORY IC

BACKGROUND OF THE INVENTION

This invention relates to an integrated circuit (IC) mounting a non-volatile semiconductor memory such as a flash memory, as well as an IC having a CPU also mounted thereon. In particular, the invention relates to the technology of making use of the results of a burn-in test on such an IC for its later use.

FIG. 4 shows a conventional non-volatile semiconductor memory IC 10 of a simple structure, mounting a non-volatile semiconductor memory serving as a flash memory 11. Many memory cells which can be electrically erased and rewritten simultaneously are arranged in arrays in the flash memory 11, and an access circuit 12 comprising address decoders and sense amplifiers is attached to it. If a control signal for a read or write operation with an address signal A is received by the access circuit 12 from outside through a terminal 13, the corresponding address in the flash memory 11 is accessed and an operation such as the output of a data signal D is carried out.

FIG. 5 shows another conventional IC 20 having not only a flash memory 11 (a non-volatile semiconductor memory) but also a CPU 21 mounted on one chip. This IC 20 includes a bus line 22 for connecting the CPU 21 with the flash memory 11 such that the CPU 21 can access the flash memory 11 therethrough. A ROM 23 for storing application programs and a DRAM 24 for carrying out operations may be also included and connected to the bus line 22, depending on the nature of the application. Also included is a logic circuit 25 for switching the access to the flash memory 11 selectively either through the CPU 21 or directly through terminals 13. If signals such as a mode signal M or a reset signal R are inputted from outside to the logic circuit 25 through terminals 26, suitable selection-switching signals S1 and S2 are generated according to the mode specified at the time of a reset. In a normal mode, the CPU 21 will be caused to access the flash memory 11 through the bus line 22 in response to selection-switching signal S1. In a test mode in view, for example, of a burn-in test, on the other hand, the access circuit 12 will serve to switch the connection of the flash memory 11, separating the flash memory 11 from the bus line 22 and connecting it to the terminals 13. Thus, as is the case with the IC 10 described above with reference to FIG. 4, a direct external access to the flash memory 11 through the terminals 13 becomes effective in such a test mode.

Japanese Patent Publication Tokkai 9-219099 disclosed still another IC which is functionally somewhere between the ICs 10 and 20 described above, being characterized as comprising a so-called self burn-in circuit, instead of a CPU, together with a flash memory for carrying out a burn-in test. In addition to the functions of the IC 10 of FIG. 4, this IC is adapted to carry out a test such as a burn-in test even in the absence of a signal input indicative of a test mode and to transmit the test results to a tester.

Either all or selected ones of such prior art non-volatile semiconductor memory ICs are subjected to a burn-in test. Such a burn-in test which has been carried out conventionally is schematically shown in FIG. 6. Since it is desirable to increase the yield of products, and since it is possible, even if a tested IC is found to have defective portions in its flash memory, to exclude such defective portions from being accessed and to treat the IC as a non-defective product so long as its total memory capacity is greater than a specified minimum required, the test includes not only a usual burn-in test process but also a subsequent process of writing necessary access data (herein referred to as the "status") into the tested non-volatile semiconductor memory IC.

To start the subject IC 10 (or 20, for example) is set inside a heater 30 for a cycle test and a burn-in test with the use of a tester 40 connected to the heater 30 through cables 31. Since it is the tester 40 that controls the tests, it is the tester 40 that sets the temperature of the heater 30 and accesses the IC 10, writing and reading data thereinto and therefrom. The results of the tests and the access data obtained by determining good or bad on the basis of obtained test results are outputted, that is, displayed on a display device 41 or a printed out by a printer 42 which may both be attached to the tester 40.

After the burn-in test is finished, the IC 10 is removed from the heater 30 and is set to a ROM writer 50 for the subsequent write process. Portions corresponding to the IC 10 are extracted from this output obtained, say, through the printer 42, and a map 11a is generated either directly from the portion of the data showing defective parts of the flash memory 11 or after converting such data into a more easily readable format including flag bits and an address list for indicating the addresses of substitute areas. Thereafter, the map 11a thus prepared is written on an available area of the flash memory 11. This process may be carried out by operating the ROM writer 50 while referencing the output data, say, from the printer 42.

When use is made of an IC 10 having such a map 11a written in its flash memory 11, the map 11a serves to prevent data from being written in or read from any of the defective portions of the flash memory 11. In summary, the results of the burn-in test are reflected in a later process such that even the IC products found to have defective portions in their flash memory can be treated as usable products.

According to this prior art technology, however, the burn-in test process which is carried out by accessing a non-volatile semiconductor memory and the subsequent write process whereby access data based on the test results are written in were separate processes each requiring human efforts. When a large number of ICs are to be processed, the operation of the ROM writer 50, for example, is enormously time-consuming. Moreover, it involves a cumbersome work to correctly associate the outputted access data with the individual ICs. Since non-volatile semiconductor memories with different memory capacities and structures are required for different applications, furthermore, the tester has to be modified in various ways in order to accommodate all these different kinds of memories.

It now goes without saying that the number of steps should be reduced as much as possible in the process for the testing. In addition, it is desirable to arrange these steps such that they can be performed continuously and automatically and that some apparatus can be used for different purposes or dispensed with. Although it may be said that the IC described in aforementioned Japanese Patent Publication Tokkai 9-219099 has contributed in improving the efficiency in the use of a tester because it contains within itself a self burn-in circuit, the improvement is only in reducing the number of control signals exchanged with the tester during a burn-in test such that a large number of chips can be tested at the same time. The problem of the amount of work to be done by the operator and the adaptability of the tester to a wide variety of ICs has not been considered.

SUMMARY OF THE INVENTION

It is therefore an object of this invention in view of the above to provide non-volatile semiconductor memory ICs on which a burn-in test can be carried out easily and by means of a simple apparatus.

A non-volatile semiconductor memory IC embodying this invention, with which the above and other objects can be accomplished, may be characterized from one point of view as having a non-volatile semiconductor memory mounted thereon and comprising a testing means for accessing the non-volatile semiconductor memory and thereby carrying out a test to determine its good/bad condition and a write means for writing results of this test in the non-volatile semiconductor memory. With a non-volatile semiconductor memory IC thus structured, the results of the burn-in test thereon can be utilized when it is used at a later time. Since both the testing means and the write means are provided to the IC, the IC plays a principal role when the test and write processes are automatically carried out. Thus, these processes can be carried out easily and quickly without the user's participation. Since the IC plays the principal role in these processes, a tester of only a simple structure is required according to this invention and a ROM writer of a conventional kind can be dispensed with. The results of the burn-in test, or access data generated from such test results, are temporarily stored in a separate memory means which is more stable than the non-volatile semiconductor memory under high temperature conditions. The temporarily stored data are later copied into the non-volatile semiconductor memory only after the temperature of the IC has returned to a normal condition and the non-volatile semiconductor memory has regained its stable condition. Thus, the test results can be accurately stored for a later use.

From another point of view, the present invention may be described as relating to a non-volatile semiconductor memory IC having both a non-volatile semiconductor memory and a central processing unit mounted thereon, the CPU having a ROM which stores a program code used thereby and a memory means for temporarily storing data. The CPU is adapted to carry out various functions according to this program code, including accessing the non-volatile semiconductor memory and thereby carrying out a test to determine its good/bad condition, temporarily storing results of this test in the memory means such as a SRAM and copying these test results from this memory means into the non-volatile semiconductor memory. Thus, testing and writing are carried out automatically, with the IC itself playing a principal role by using the stored program code. Temporary storing of the test results is also carried out automatically by the CPU program and a memory means different from the non-volatile semiconductor memory of the IC is used for the purpose. Since such a memory means for temporarily storing test results need not be a device with a large capacity, a device with a more stable memory structure than the non-volatile semiconductor memory can be adopted. Since the CPU and its ROM can be formed with a logic circuit and a mask ROM, they are more stable than the non-volatile semiconductor memory. Thus, testing and writing can be carried out more accurately and dependably.

In other words, in addition to the non-volatile semiconductor memory and a CPU of a conventional type, it is only necessary to provide a ROM and a temporarily storing memory means. Thus, the scale of the IC circuit and the chip size can be prevented from becoming unreasonably large. In summary, operations and devices related to a burn-in test can be made much simpler with a non-volatile semiconductor memory IC embodying this invention.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a schematic block diagram of a non-volatile semiconductor memory IC to show its internal structure;

FIG. 2 is a sketch of the IC of FIG. 1 when undergoing a burn-in test, with the tester shown by way of a schematic block diagram;

FIG. 3 (comprising FIGS. 3A, 3B, 3C and 3D) shows changes in conditions during such a burn-in test, FIG. 3A showing the temperature variations and FIGS. 3B, 3C and 3D showing changes in conditions of access to the memory;

FIG. 4 is a block diagram of a prior art flash memory IC;

FIG. 5 is a block diagram of another prior art flash memory IC having a CPU mounted thereon; and FIG. 6 is a sketch of the prior art IC shown in FIG. 4 or 5 undergoing a prior art burn-in test.

Throughout herein, like or equivalent components are indicated by the same numerals even where they are components of different devices and may not necessarily be described repetitiously.

DETAILED DESCRIPTION OF THE INVENTION

The invention is described next by way of an example with reference to drawings. FIG. 1 is a block diagram of the internal structure of a non-volatile semiconductor memory IC 60 embodying this invention. Since it is somewhat similar to the prior art IC 20 described above with reference to FIG. 5, the same numerals are used in FIG. 1 to indicate substantially similar or at least equivalent components, and repetitive explanations will be dispensed with for the efficiency of disclosure.

The IC 60 of FIG. 1 is different from the prior art IC 20 in that there are additionally included a ROM (or the "mask ROM") for storing the program code of a test routine 61a to be carried out by the CPU 21 and a SRAM 62 which is used by the CPU 21 for temporarily storing the status 62a during a testing according to this test routine 61a. The logic circuit 63 of the IC 60 is accordingly different from the logic circuit 25 of the prior art IC 20 in that it serves to activate the CPU 21 to have the test routine 61a carried out during a burn-in test although the operation is in the test mode. During such a test, it also serves to receive a copy signal C from outside, say, through a terminal 26, and to thereby carry out a copying process according to the test routine 61a.

A memory with a small capacity connected to the bus line 22 is sufficient to serve as the mask ROM 61. Since a common test routine 61a can be used as long the structures of ICs are the same, it is a stable memory even under a high temperature condition. The SRAM 62, too, may comprise a memory device with a small capacity connected to the bus since it is required only to store the test results, or the status 62a. For example, this may be a stable memory under high temperatures, comprising transistors and having a cell structure such that a bistable condition can be maintained statically.

The test routine 61a to be carried out by the CPU 21 is structured such that a test process and a write process, to be described below, can be continuously and automatically performed. In the test process, the flash memory 11, which tends to more easily manifest a faulty condition under a high temperature condition, is accessed while it is being heated and its good/bad condition is determined. In the write process, the results of the burn-in test or access data generated on the basis of the burn-in test results (the "status" 62a) are finally written into the flash memory 11. The status 62a, however, may not necessarily be written into the flash memory 11 immediately but may be temporarily stored while the flash memory 11 is unstable and later written into the flash memory 11 as a map 11a after the flash memory 11 has stabilized. In other words, the status 62a is written into the SRAM 62 while the burn-in test is being carried out, but when a copy signal C is received at or after the end of the burn-in test, the status 62a is copied from the SRAM 62 to a suitable excess area of the flash memory 11.

The burn-in test on the IC 60 thus structured will be described more in detail with reference to FIGS. 2 and 3. FIG. 2 shows the outline of the burn-n test and FIGS. 3A, 3B, 3C and 3D (herein summarily referred to as FIG. 3) show changes in various conditions of access to the memory.

In this burn-in test, too, the IC 60 is set inside a heater 30 and the test is carried out while the temperature inside the heater 30 is changed. The tester 70, which is used in this burn-in test embodying the invention, is much more simplified than the prior art tester 40 described above with reference to FIG. 6. The tester 70 still includes a temperature-setting routine 71 for controlling the temperature inside the heater 30 but since the step-by-step processing of the test and the judgment of good or bad are carried out by the IC 60 itself as parts of the functions of the test routine 61a, the read and write routines as well as the judgment routine are eliminated from the tester 70. A display and a printer such as those described above in connection with the prior art tester 40 of FIG. 6 may be present but they are no longer essential. Instead, the tester 70 is provided with a test mode setting routine 72 which only serves to transmit through cable 31 a mode signal M and a reset signal R to the IC 60 at an appropriate timing and a copy routine 73 which only serves to transmit a copy signal C.

When a burn-in process is started with the heater 30 and the tester 70 as described above, the temperature setting routine 71 controls the environmental temperature of the IC 60 inside the heater 30 to raise it from the initial room temperature level (say, 25° C.) to about 70° C. at specified time t1. As shown in FIG. 3A which indicates the temperature setting by a solid line and the actual temperature variations by a dotted line, this environmental temperature is maintained at this level between times t1 and t2 and is then raised to a higher level about 125° C. It is maintained at this higher level until later time t3 and then is then returned to the room temperature level at still later time t4.

Concurrently therewith, the test mode setting routine 72 and the copy routine 73 operate such that a mode signal M and a reset signal R for commanding a cycle test are transmitted to the IC 60. In response to these signals, the IC 60 serves to repeat the cycle test according to the test routine 61a between times t1 and t2 as shown in FIG. 3A. During this cycle test period, specified test data are written into the entire area of the flash memory 11, read out therefrom and checked, as schematically illustrated in FIG. 3B, such that it can be ascertained whether erase, write and read operations can be correctly carried out even under critical conditions of the specification.

At time t2 when the temperature is raised or immediately thereafter, a mode signal M and a reset signal R for commanding a burn-in test are transmitted from the tester 70 to the IC 60. Upon receiving these signals, the IC 60 again uses the test routine 61a stored in the mask ROM 61 and repeats the checking of the read out data which were written in during the period of the cycle test, as schematically shown in FIG. 3C. Since the flash memory 11 is at a higher temperature during this operation, its condition is such that write and erase operations may not be carried out dependably but read out operations are still possible and many of the data are correctly read out. As for those of the data written in unstable areas which can operate under normal conditions at a room temperature but may be unreliable under severe conditions or after a long time of use, however, occurrence of incorrect reading is likely.

If an occurrence of incorrect reading is detected during this burn-in test on the flash memory 11 by the test routine 61a, a flag indicative of a bad condition is set in the status 62a stored in the SRAM 62 corresponding to a specified unit of area such as a sector or a block which includes the position where the occurrence of incorrect reading has been detected, as also shown in FIG. 3C. This is how the non-volatile semiconductor memory 11 is accessed to test its good/bad condition and its access data (status) 62a are generated from the results of such a test in the form of being temporarily stored in the SRAM 62.

After the temperature of the IC 60 has returned to the normal level (say, at time t4 as shown in FIG. 3A), the copy routine 73 causes a copy signal C to be transmitted from the tester 70 to the IC 60. Upon receiving this copy signal C, the IC 60 uses the test routine 61a stored in the mask ROM 61 again to read out the status 62a stored in the SRAM 62 and to write it into the map 11a inside the flash memory 11. Thus, the access data 62a which have been temporarily stored in the SRAM 62 are finally copied into the non-volatile semiconductor memory 11.

After the burn-in test is thus completed, the memory IC 60 is removed from the heater 30. By this time, the IC 60 is already provided with a map 11a containing the test results. The IC 60 thus prepared can be immediately put to an actual use, depending on the test results.

The invention has been described above with reference to only one example but this example is not intended to limit the scope of the invention. Many modifications and variations are possible within the scope of the invention. For example, it does not have to be an SRAM that is to be used for temporarily storing access data. Any device such as a register file which is more stable than the flash memory 11 under high temperature conditions can be used for the purpose. Although a mode of operation in which a single IC is tested at one time has been shown above, this invention may also be adapted to situations where many ICs are set in the heater 30 and tested together. Moreover, the map 11a need not be prepared at any specified area within the flash memory 11. A routine may be so set that the data in all areas of the flash memory are initially erased. In such an application, a specified easily detectable pattern may be attached to the map 11a, say, at its beginning, in addition to taking care so as to avoid areas containing defects.

There are many advantages to be gained by the present invention. Since the access data are prepared automatically according to this invention without requiring the operator to write them in by means, for example, of a ROM writer of the type described above with reference to FIG. 6, the work can be done easily and within a much shorter time. Since only a tester of a simpler structure is required and the same tester can be used for testing non-volatile semiconductor memory ICs of different types because it serves only to output command signals. Since the IC itself plays a principal role in the test and write processes, the series of required steps can be performed accurately and quickly. As a welcome consequence, the work involved becomes simpler, requiring only a device which is simpler in structure. According to the present invention, furthermore, it can be dependably avoided to write in data in the memory device under an unstable condition undergoing a burn-in test. Thus, access data can be more accurately stored.

What is claimed is:

1. A burn-in test system comprising a non-volatile semiconductor memory IC, a heater for heating said non-volatile semiconductor memory IC and a tester for outputting a signal to said non-volatile semiconductor memory IC; said non-volatile semiconductor memory IC including:

a non-volatile semiconductor memory;

testing means for accessing said non-volatile semiconductor memory and thereby carrying out a test while said heater is used to heat said non-volatile semiconductor memory when said signal is received from said tester to determine a good/bad condition of said non-volatile semiconductor memory; and write means for writing results of said test in said non-volatile semiconductor memory.

2. The system of claim 1 further comprising temporarily storing means for temporarily storing said results of said test.

3. The system of claim 1 wherein said testing means further serves to generate access data from said results of said test and said write means writes in said access data as said results of said test.

4. The system of claim 2 wherein said temporarily storing means comprises a SRAM.

5. A non-volatile semiconductor memory IC comprising:

a non-volatile semiconductor memory; and a central processing unit CPU provided with a ROM which stores a program code used by said CPU and a memory means for temporarily storing data, wherein both said ROM and said memory means are more stable than said nonvolatile semiconductor memory under high-temperature conditions of burn-in tests, and wherein functions of said CPU by said program code include:

accessing said non-volatile semiconductor memory and thereby carrying out a test to determine a good/bad condition of said non-volatile semiconductor memory;

temporarily storing results of said test in said memory means; and copying said results of said test from said memory means into said non-volatile semiconductor memory.

6. The non-volatile semiconductor memory IC of claim 5 wherein said results of said test are stored in a form of access data generated from said results of said test and said CPU functions to copy said access data as said results of said test into said non-volatile semiconductor memory.

7. The non-volatile semiconductor memory IC of claim 5 wherein said memory means comprises a SRAM.

8. The non-volatile semiconductor memory IC of claim 5 wherein said CPU further serves to avoid a defective area of said non-volatile semiconductor memory to copy said results of said test from said memory means.

9. The non-volatile semiconductor memory IC of claim 5 wherein the copy of said results of said test from said memory means into said non-volatile semiconductor memory is carried out after temperature of said non-volatile semiconductor memory returns from a high level during said test to a normal room temperature level.

10. A non-volatile semiconductor memory IC comprising:

a non-volatile semiconductor memory;

testing means for accessing said non-volatile semiconductor memory and thereby carrying out a test to determine a good/bad condition of said non-volatile semiconductor memory;

write means for writing results of said test in said non-volatile semiconductor memory; and temporarily storing means for temporarily storing said results of said test, said temporarily storing means being more stable than said non-volatile semiconductor memory under high-temperature conditions of burn-in tests.

11. The non-volatile semiconductor memory IC of claim 10 wherein said testing means further serves to generate access data from said results of said test and said write means writes in said access data as said results of said test.

12. The non-volatile semiconductor memory IC of claim 10 wherein said temporarily storing means comprises a SRAM.

13. The system of claim 1 wherein said tester outputs signals to said non-volatile semiconductor memory IC through a cable.

14. The system of claim 1 wherein said heater controls the temperature of said non-volatile semiconductor memory IC according to signals received from said tester.

* * * * *